United States Patent [19]

Heckl

[11] 3,913,215

[45] Oct. 21, 1975

[54] PROCESS FOR THE PRODUCTION OF A SEMICONDUCTOR COMPONENT

[75] Inventor: Herwig Heckl, Munich, Germany

[73] Assignee: Siemens Aktiengesellschaft, Berlin & Munich, Germany

[22] Filed: May 6, 1974

[21] Appl. No.: 467,300

[30] Foreign Application Priority Data

May 9, 1973 Germany .......................... 2323438

[52] U.S. Cl. ........................ 29/578; 29/580; 156/17

[51] Int. Cl.[2] ........................................ B01J 17/00

[58] Field of Search ......... 29/580, 578, 583; 156/17

[56] References Cited

UNITED STATES PATENTS

| | | | |
|---|---|---|---|
| 3,427,708 | 2/1969 | Schutze | 29/580 |
| 3,519,506 | 7/1970 | Topas | 156/17 |
| 3,523,223 | 8/1970 | Luxem | 29/580 |
| 3,689,993 | 9/1972 | Tolar | 29/580 |

*Primary Examiner*—W. Tupman
*Attorney, Agent, or Firm*—Hill, Gross, Simpson, Van Santen, Steadman, Chiara & Simpson

[57] ABSTRACT

Process for fabricating a semiconductor component such as a transit time avalanche diode or a Gunn diode where extremely small thicknesses of the semiconductor layers are involved and in which heat must be rapidly dissipated when in use. The component in a preferred process includes forming a plurality of recesses in a grid-like pattern in one surface of a semiconductor substrate, forming an epitaxial layer on one surface of the substrate opposite the surface in which the recesses are formed, forming a first electrode on the exposed surface of the epitaxial layer, forming a second electrode at the base of each recess in a centrally located area, placing the substrate with its epitaxial layer and second electrode on a metal base plate causing a ram to bear against the upstanding walls of the recesses to unite the second electrode by thermal compression to the base plate to provide good heat transfer relationship therewith, removing the material of the substrate forming the upstanding walls and enough of the remaining material of the substrate and the epitaxial layer to form a frustum-shaped semiconductor component.

18 Claims, 5 Drawing Figures

PROCESS FOR THE PRODUCTION OF A SEMICONDUCTOR COMPONENT

FIELD OF THE INVENTION

This invention relates to the field of making extremely small semiconductor components such as avalanche transit time diodes or Gunn diodes which require a mounting in which heat may be rapidly dissipated from the diode when in use. It has been found difficult in the past to bond such a component to a heat dissipating base plate, since the application of pressure to such a component when it is in its finished form frequently causes damage to the component, and attempts to apply heat to bring about the bonding without the application of pressure also tends to damage the component. The present invention relates to a novel process for the production of a semiconductor component and mounting it on a heat dissipating base plate without damage to the component itself.

BRIEF SUMMARY OF THE INVENTION

A preferred form of the invention provides a process which includes forming a plurality of recesses in a grid-like pattern in one surface of a semiconductor substrate, forming an epitaxial layer on one surface of the substrate opposite the surface in which the recesses are formed, forming a first electrode on the exposed surface of the epitaxial layer, forming a second electrode at the base of each recess in a centrally located area, placing the substrate with its epitaxial layer and first electrode on a metal base plate causing a ram to bear against the upstanding walls of the recesses to unite the second electrode by thermal compression to the base plate to provide good heat transfer relationship therewith, removing the material of the substrate forming the upstanding walls and enough of the remaining material of the substrate and the epitaxial layer to form a frustum-shaped semiconductor component.

DESCRIPTION OF THE PREFERRED EMBODIMENTS

Figure 1:
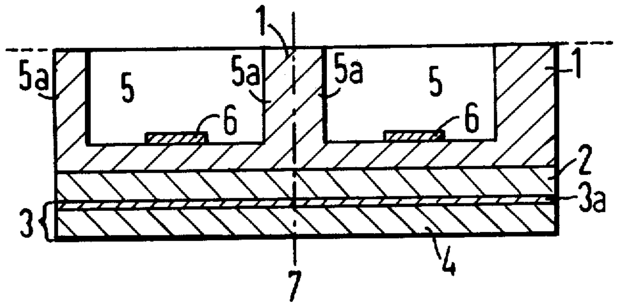
FIG. 1 of the drawing is a sectional view showing the initial steps in a preferred process.

The present invention relates to a process for the production of a semiconductor component in which a disc-shaped semiconductor crystal is covered on one side with a uniform epitaxial semiconductor layer, and then material is removed from the semiconductor surface in such manner that a recess is formed, and in which both the epitaxial layer and the material of the original semiconductor crystal is provided with at least one electrode.

Processes of this type are known for example for the production of mesa diodes and mesa epitaxial transistors. The recess is formed in such a manner that one mesa or a plurality of mesas are formed on the same side of the disc-shaped semiconductor body. Usually the mesa is etched on the side of the arrangement provided with the epitaxial layer — it being possible for the junction between the epitaxial layer and the original semiconductor material to be a pn-junction, but also an $n^+n$ or $p^+p$ junction. In the two latter cases one generally commences from a highly doped substrate on whose surface is epitaxially deposited a less highly doped layer of the same semiconductor material from the gas phase. Then the elements which are essential to the functioning of the arrangement will be contained in the mesa whereas the original crystal is actually only required to play the part of a carrier and an electrode.

The present invention, on the other hand, is concerned not with the mesa technique, but with the production of a so-called thin layer element preferably an avalanche transit time diode, a Gunn diode, a varactor diode and similar elements. Here semiconductor compounds, in particular gallium arsenide will preferably be used, which are known to be more brittle than silicon or germanium. These elements frequently consist merely of very thin layers which are arranged between two laminar electrodes, one electrode assuming the function of a carrier of the relevant system.

In the production of such thin layer elements, e.g., avalanche transit time diodes or Gunn diodes it is necessary to produce a semiconductor monocrystal of a very small thickness which is provided on both its main surfaces with, in each case, one electrode which produces a satisfactory contact. Here the heating of the system can hardly be avoided. On cooling, the semiconductor material and the electrode will then contract to different extents, resulting in tensions in the semiconductor body and the follow-up phenomena such as the danger of fracture of the semiconductor and an uncontrolled variation in etching attack in the case of any subsequent etching processes, bending of the thin semiconductor wafer and detachment of the electrode. On account of their brittleness, known semiconductors such as GaAs or GaP are exposed to greater danger than silicon and Ge.

The aim of the invention is to provide a way by which these disadvantages may be avoided.

This way consists in carrying out a process as set forth in the introduction. Following the production of the epitaxial semiconductor layer on a semiconductor substrate, the side of the epitaxial layer facing away from the original semiconductor substrate is covered with a first metal electrode in the form of a layer, and then the original substrate is, on the side facing away from the epitaxial layer, provided with at least one recess. The inside of each recess is provided with an etching mask, which preferably forms a second electrode. With the aid of this etching mask, semiconductor material is etched away from all around this etching mask, in such a manner that the semiconductor surface which has been newly formed as a result of the etching process intersects the junction between the epitaxial layer and the material of the original semiconductor crystal at least once along a closed curve and that the second metal electrode is applied at the location of the etching mask.

It will be apparent that in this way a semiconductor element is formed which is contacted between two opposite-lying electrodes, and the thickness of which is less than the overall thickness of the original crystal and the epitaxial layer. It is possible to set the thickness of the semiconductor body between the two electrodes, without difficulties, to be so slight that it practically corresponds only to the thickness of the epitaxial layer, although the junction between the material of the epitaxial layer and the material of the original semiconductor crystal is to be present in the finally obtained semiconductor body of the semiconductor component which is to be produced. If this junction is a pn-junction, it will have a rectifying function in the element, whereas, if it is a p+p or n+n junction, the remainder of the original crystal will have the function of an ohmic contact and will then usually have a higher doping concentration than the epitaxial layer.

It should be noted that preferably the removal process is carried out using the etching mask, produced in the recess, to the point at which the removal reaches the first metal electrode, along a closed ring, or in other words the semiconductor body which remains under the etching mask and is to be further processed to form the desired semiconductor component obtains the shape of a frustum, which transversely traversed by the junction between the epitaxial layer and the basic material, is on its base surface covered by the etching mask or the second metal electrode which may replace the latter, and on its top surface is covered by the first metal electrode which latter mainly serves as a carrier of the element.

The recess which, in accordance with the invention, is to be produced in the material of the original semiconductor body following the application of the first metal electrode, is expediently produced by means of an etching process and an etching mask. As a photo lacquer technique is usually used for this purpose in order to ensure precise etching geometry and since this technique has been mastered, it is particularly advisable to employ this method in this case. The recess will expediently be in the form of a pit or trench of uniform depth. As a plurality of similar semiconductor elements are generally produced from one single semiconductor disc, it will be expedient to proceed in the same manner in this situation. Then a number of identical pits, e.g., of circular or square cross-section which number corresponds to the number of elements which are to be produced are etched onto the side of the substrate facing away from the epitaxial layer arranged in an orthogonal two-dimensional grid pattern. The depth of the pits is then contrived to be such that they do not reach the epitaxial layer. The depth is contrived to be identical for all the pits, which presents no difficulties when a controlled etching process is used.

Instead of using pits, it is also possible to use a system of trenches which possess the same depth and intersect one another in the form of a grid pattern. Then mesa-like projections of e.g., square cross-section will be formed between the trenches. Between two adjacent mesa-like projections of this type there is then in each case inserted an etching mask or second electrode which are separated in insular fashion from the others of their type and naturally also from the first electrode. By means of the etching process one then removes the projecting mesas and also the material on the base of the trenches around the individual etching masks, in accordance with the invention.

The invention has been illustrated in several forms by FIGS. 1 to 5. Here every example has been based upon a disc-shaped semiconductor crystal 1 consisting of GaAs of the N+ type, on whose one main surface a n-conducting GaAs layer 2 has been epitaxially produced, e.g., from the gas phase or a solution of GaAs in Ga, of corresponding composition. The semiconductor disc 1 without the epitaxial layer 2 has a thickness of for example 100 to 400 μm, and the epitaxial layer 2 has a thickness of 2 μm. The doping of the starting crystal can, e.g., amount to $2 \times 10^{17}$ /cm³ and that of the epitaxial layer to $2 \times 10^{16}$ /cm³.

As shown in FIG. 1, the free main surface of the epitaxial layer 2 is now covered with a first metal electrode 3 in the form of a layer. This electrode will have rectifying properties if an avalanche transit time diode or a varactor diode is to be produced. Otherwise, e.g., in the production of a Gunn diode, both electrodes of the diode are designed as ohmic contacts. A rectifying electrode can be of such a character that it forms a pn-junction with the material of the epitaxial layer 2 or forms a Schottky contact.

In the present example, the electrode 3 forms a Schottky contact with the material of the epitaxial layer 2. In the case of n-conducting GaAs, it is possible to use Cr, Ni, Pt, Pd, Mo, Ti, which is applied, e.g., by vapour deposition or by means of cathode sputtering. Many of these metals, e.g., Cr, are expediently applied merely in the form of a thin layer *3a* which is, e.g., 1 μm thick, which is then strengthened by a layer 4, of a second metal which has more favorable mechanical properties, e.g., Ag and/or Au. The first electrode has a thickness of between 2 μm and 20 μm. It will then be sufficiently sturdy to also assume the role of a support for the semiconductor system during the later assembly of the semiconductor components being produced.

If the thickness of the starting crystal is greater than 100 μm, it is advisable to reduce this thickness by means of a uniform removal process on the substrate side, e.g., by etching or lapping, before the next stage of the process takes place, namely the production of the recesses on the surface of the substrate.

The production of the recesses is carried out with the aid of a photo lacquer etching technique. In the present example, pit-like recesses arranged in an orthogonal grid-like pattern are to be produced, which nowhere reach the boundary between the starting crystal and the epitaxial layer. The pattern of the pit-like recesses 5 may have intervals of, e.g., 500 or 700 or 1000 μm, the cross-sectional diameter of these round or square recesses amounting to 300 to 800 μm. Their depth is designed to be such that a uniform n+n conducting layer having a thickness of 5 to 30 μm remains between the base of the pit-like recess and the n+n junction between zones 1 and 2. As will also be seen from FIG. 2, the base of each of these recesses 5 is provided with a second metal electrode 6 which provides a non-blocking contact with the adjacent N- conducting GaAs. This electrode consists, for example, of a gold-germanium alloy.

Following the production of the non-blocking contact, the arrangement is split up into the individual elements along the comb-like projections which have remained between the individual pit-like recesses 5. This can be effected, for example, by etching and/or sawing along the dividing lines 7 (FIG. 1).

Figure 2:
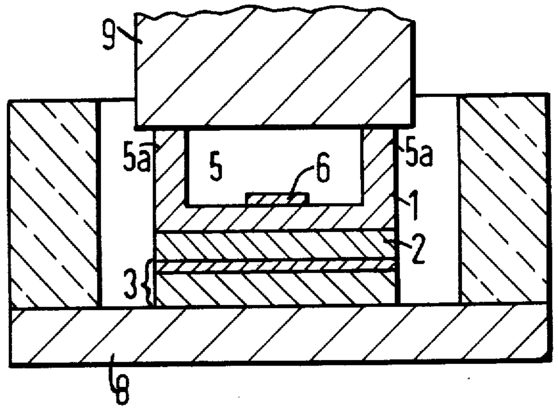
FIG. 2 is a sectional view showing one component placed on a base plate with a ram applying pressure to the wall of one recess.

The individual element which is obtained in this way is now permanently connected to a metallic base plate, for example, the metallic base plate of a housing, in that the first electrode 3, 4, which is in the form of a layer is brought into permanent union, for example, by soldering or welding, with the base plate 8. This can be carried out, for example, by thermo-compression, it being possible for the parts of the comb-like projections 5a which have remained in the individual element to be used as point of application for a ram-like tool 9 which is employed for the thermo-compression (FIG. 2). If the electrode 6 cannot be used as an etching mask, for the second etching process which now follows, it will be covered with an insulating layer 10 of etch-resistant material, for example, photo lacquer. Otherwise, it is not absolutely essential to use such an etching mask 10.

It is now in accordance with the invention to proceed in such a manner that the remaining semiconductor material is removed at least to such an extent that the junction between the former zones 1 and 2 is exposed, along a curve closed in the form of a ring, by means of the following etching process. Preferably, the etching process is continued until beneath the etching mask 10, by way of semiconductor residue forming the semiconductor body of the element, there remains only a frustum-shaped structure 11, the one top surface of which is covered by the electrode 6 and the etching mask 10 which protects the latter, and the other top surface of which is covered by the first metal electrode 3*a*, 4. This state is reached when the etching fronts which appear from the non-protected parts of the semiconductor surface at the base of the recesses 5 have in fact reached the first electrode 3*a*, 4 along a ring-shaped closed line.

Figure 3:
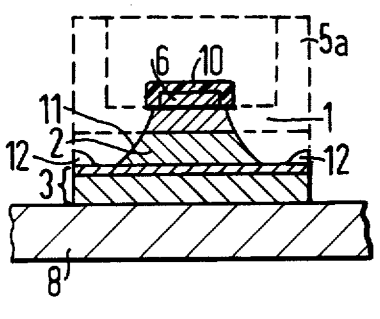
FIG. 3 is a sectional view illustrating the finished component as it has been etched to provide its frustum shape.
Figure 4:
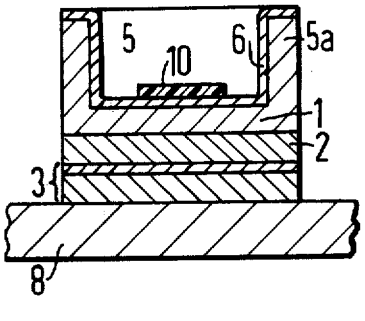
FIG. 4 is a sectional view exemplifying a modified form of the invention.

As considerably more material may be available for removal on the comb-like projections 5a than on the base of the recesses 5, it can occur that the frustum-shaped semiconductor body 11 which forms the actual diode will have in its vicinity additional semiconductor material 12 which is likewise borne by the first metal electrode but possesses no significance for the functioning of the process (FIG. 3). This material can be etched away preferably when the actual semiconductor body 11 has been covered.

In the case of the simultaneous production of a plurality of such diodes, it is easily possible to carry out the etching process which leads to the frustum-shaped semiconductor body 11, forming the actual element, prior to the division of the arrangement into the individual element. It is also possible to choose the two metal electrodes to be such that both form an ohmic contact with the adjacent semiconductor material. This is the case, for example, in the production of a Gunn diode. On the other hand, the first metal electrode can also contain a doping material in such a manner that it forms a pn-junction with the adjacent semiconductor material as, in the example featuring the N+ conducting GaAs, epitaxial layer 2. In this case, the process of the invention leads to a varactor diode. Finally, instead of n-conducting semiconductor material, it is also possible to use p-conducting material for example, a pp+ disc.

The second metal electrode 6 can also be applied in the form of a metallization continuously covering that side of the arrangement shown in FIG. 2, which is provided with the recesses 5. The application is carried out, for instance, galvanically or by means of vaporization. In this case, an etching mask 10 is necessary, which covers in an island-like manner a part of the electrode metal at the bottom of the recess 5, and which effect the creation of a frustum-shaped semiconductor structure (FIG. 4) during the subsequent second etching process.

After the final etching process has taken place, an etching mask 10, which may have been used and which does not serve as second metal electrode, is removed. Then a contact is effected in a known manner mainly via a metallic housing lid to the metal electrode 6 forming together with the first metal electrode 3a, 4 of the metallic base plate 8 a thin-layer diode being mounted in a power housing with its insulating side wall.

The embodiment of the concept of individual recesses 5 as pits is only one embodiment. Instead of discrete pits, a net of homogeneous ditches crossing each other in a raster fashion, may be chosen, for example, during the simultaneous production of several elements from a single semiconductor disc. Then, each ditch is bordered by two rows of mesa-like projections which have uniform dimensions. One electrode 6 is arranged each time in the bottom of the ditch-like recesses between each two mesa-like projections. Each of these island-like electrodes 6 or an etching mask 10 covering them, then results during the concluding second etching process in one frustum-shaped semiconductor body 11 which is penetrated by a part of the original junction between the layers 1 and 2 and which is provided with each one metal electrode at its two end surfaces.

Figure 5:
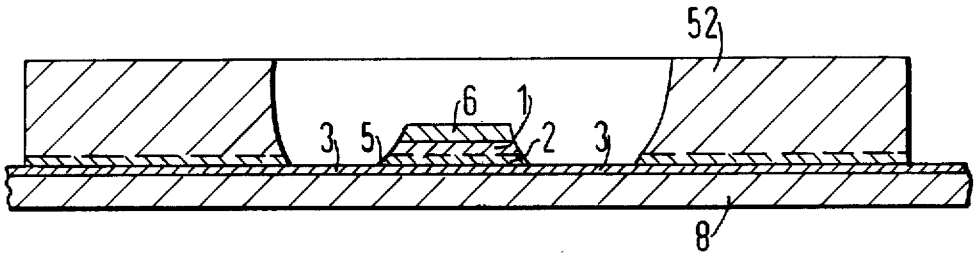
FIG. 5 is a sectional view of a further modified form of the present invention.

FIG. 5 shows a variation of the invention, wherein a strong outer ring 52 is left around the finished element on the base plate 8. This provides a strong structure for the finished article. The thickness of the layer 52 may, by way of example, be between 0.1 to 0.3 mm.; the base plate may be, for example 0.1 mm. The overall length of the layer 52 may, for example, be 1 mm, and the diameter or a comparable length of the element 1, 2 is, for example, about 0.1 mm. The thickness of layers 1 and 2 together is in the range of several $\mu$m.

It will be apparent to those skilled in the art that many modifications and variations may be effected without departing from the spirit and scope of the novel concepts of the present invention.

I claim:

1. Process for the production of a semiconductor component in which a disc-shaped semiconductor crystal is covered on one side with a uniform epitaxial semiconductor layer, and then material is removed from the semiconductor surface in such a manner that a recess is formed, and in which both the epitaxial layer and the material of the original semiconductor crystal is provided with at least one electrode, characterized in that following the production of the epitaxial semiconductor layer, the side of the epitaxial layer facing away from the original semiconductor crystal is first covered with a first metal electrode in the form of a layer, then the original semiconductor crystal is, on the side facing away from the epitaxial layer, provided with at least one recess and inside the recess is provided with an etching mask which preferably forms the second electrode, and with the aid of this etching mask, semiconductor material is etched away from all around this etching mask, in such a manner that the semiconductor surface which has been newly formed as a result of the etching process intersects the junction between the epitaxial layer and the material of the original semiconductor crystal at least once along a closed curve, and that the second metal electrode is applied at the location of the etching mask.

2. Process according to claim 1, in which the recess which is produced on the side of the original semiconductor crystal which faces away from the epitaxial layer has the form of a pit which is bounded all around by parts of the semiconductor surface which are at a higher level, and which in particular has a uniform base depth.

3. Process according to claim 1, in which the recess which is produced on the side of the original semiconductor crystal facing away from the epitaxial layer obtains the form of a trench which traverses the whole of the side and has a uniform base depth.

4. Process according to claim 1, in which the second removal process which takes place on the side of the original crystal facing away from the epitaxial layer and which is carried out with the aid of the etching mask arranged on the base of the recess on this side, is continued until around the frustum-shaped semiconductor material which remains beneath the etching mask, there is exposed at least one strip, surrounding said frustum in ring shape, of the surface of the first metal electrode.

5. Process according to claim 1, in which the epitaxial layer and the basic semiconductor material together form a pn-junction.

6. Process according to claim 1, in which the epitaxial layer and the original crystal together form a junction between zones of the same conductivity type but of different doping strength.

7. Process according to claim 1, in which a disc-shaped semiconductor crystal consisting of N+ conducting GaAs is used as original crystal and on the one side of the latter there is epitaxially deposited an n-conducting GaAs layer, that said epitaxial GaAs layer is covered with a first metal electrode which produces a rectifying contact, in particular a Schottky contact, and that the thickness of this metal electrode is set to be such that it is suitable as a carrier, capable of bearing mechanical stresses, of the system.

8. Process according to claim 1, in which the material of the first metal electrode and of the second electrode is produced by means of vapor deposition, sputtering, galvanic deposition and/or pyrolytic deposition from a suitable reaction gas using a vaporization mask.

9. Process according to claim 1, in which at least on the side which is adjacent to the semiconductor, the first metal electrode is produced from a group of metals including Cr, Ni, Pt, Mo, Ti, and on the side facing away from the epitaxial layer is produced from a silver and/or gold alloy, possibly with the metal of the first layer.

10. Process according to claim 1, in which on the installation of the element, the latter is, by its first metal electrode, permanently connected to a metallic plate in particular a housing plate.

11. Process according to claim 10, in which the first metal electrode is permanently connected to a metallic carrier, in particular, the metal base of a housing by means of thermo-compression.

12. Process according to claim 10, in which the second removal process which takes place on the side facing away from the epitaxial layer and is carried out with the aid of the etching mask arranged on the base of the recess, occurs inside an etch-resistant housing.

13. The process of fabricating a thin layered semiconductor component and securing it to a heat sink which includes taking a semiconductor slab, forming an epitaxial layer on one main surface thereof, forming a plurality of recesses arranged in grid-like fashion in the other main surface of the slab which are of such depth as to not reach the epitaxial layer, forming an electrode on the exposed surface of the epitaxial layer, forming a second electrode at the bottom of each recess, separating the thus formed assembly into a plurality of individual units each having one recess with a surrounding upstanding wall, placing the thus formed unit on a metal base plate, applying a compressive load under heat to said wall in the direction of said base plate, thereby uniting the base plate to the said unit by thermo-compression, and etching away said upstanding wall and portions of said substrate and said epitaxial layer to leave a frustum-shaped semiconductor component.

14. A process according to claim 13, in which the thickness of the base of each recess is 5 to 30 $\mu$m.

15. A process according to claim 13, in which the crosswise dimension of each recess is 300 to 800 $\mu$m.

16. A process according to claim 13, in which the thickness of the epitaxial layer is approximately 2 $\mu$m.

17. A process according to claim 13, in which the thickness of the semiconductor slab before the epitaxial layer is applied is 100 to 400 $\mu$m.

18. A process according to claim 13, in which the thickness of the first electrode is 2 to 20 $\mu$m.

* * * * *